United States Patent [19]

Norell

[11] Patent Number: 4,519,760

[45] Date of Patent: May 28, 1985

[54] MACHINE FOR FILLING VIA HOLES IN AN INTEGRATED CIRCUIT PACKAGE WITH CONDUCTIVE INK

[75] Inventor: Ronald A. Norell, Carlsbad, Calif.

[73] Assignee: Burroughs Corporation, Detroit, Mich.

[21] Appl. No.: 595,658

[22] Filed: Apr. 2, 1984

[51] Int. Cl.³ .......................... B29C 3/00; B29F 3/01; B05C 1/00

[52] U.S. Cl. .................... 425/113; 101/126; 101/129; 118/213; 425/129 R; 425/406; 425/417

[58] Field of Search ........... 425/110, 113, 127, 129 R, 425/406, 417; 101/114, 115, 126, 129, 401.1; 118/213

[56] References Cited

U.S. PATENT DOCUMENTS

| 3,172,358 | 3/1965 | Weiss | 101/126 |
|---|---|---|---|
| 3,226,255 | 12/1965 | Cieniewicz et al. | 118/213 |
| 3,530,792 | 9/1970 | Valieia | 101/115 |
| 4,043,683 | 8/1977 | Costa et al. | 101/114 |
| 4,094,716 | 6/1978 | Lopez | 101/126 |

Primary Examiner—Willard E. Hoag
Attorney, Agent, or Firm—Charles J. Fassbender; Kevin R. Peterson

[57] ABSTRACT

A machine for filling a plurality of via holes in a workpiece comprises a hollow member having an open face; a masking member covering the face and having a plurality of holes which are arranged across the face such that they match the via holes in the workpiece; a diaphragm inside of the hollow member having a front surface that forms a first cavity with the masking member for receiving a high viscosity conductive ink and having a back surface that forms a second cavity with the hollow member; a means for holding the workpiece against the masking member such that their respective holes are aligned; and an orifice in the hollow member for introducing a fluid under pressure into the second cavity and against the back surface of the diaphragm to thereby squeeze a portion of the high viscosity ink through the holes of the masking member and into the holes of the workpiece.

11 Claims, 6 Drawing Figures

MACHINE FOR FILLING VIA HOLES IN AN INTEGRATED CIRCUIT PACKAGE WITH CONDUCTIVE INK

BACKGROUND OF THE INVENTION

This invention relates to machines for fabricating integrated circuit packages; and more particularly, it relates to machines for filling a plurality of via holes in flat green ceramic substrates with a conductive ink.

Integrated circuit packages are conventionally made of several laminated flat layers of ceramic. Typically, the bottom layer is a solid rectangle, and the top layers are rectangles with a hole punched through their center. An integrated circuit die is placed in the hole of the top layers and attached to the bottom layer. Bonding wires make electrical connections between signal pads on the die and a set of conductors that are on the face of an internal layer near the hole. Signals on those conductors are routed to the top ceramic layer by conductor filled via holes which penetrate through the top and internal ceramic layers. Then another set of conductors on the top ceramic layer routes the signals from the filled via holes to stiff conductive leads which are suitable for mounting the package to a printed circuit board.

In the process of making the above-described integrated circuit package, the desired via hole pattern is punched into a flat green ceramic wafer. Subsequently these via holes are filled with a conductive ink. Thereafter the desired conductor pattern is screened onto the surface of the green ceramic; the various green ceramic layers that make up the package are placed on top of one another and are squeezed together under high pressure; and the composite laminated structure is hardened by subjecting it to a high temperature environment.

This invention describes a new and superior machine for carrying out the above-described step of filling the via holes in the green ceramic wafer with conductive ink. Prior to this invention, the inventor utilized a "squeegee" to manually fill the via holes. With this method, which is herein referred to as method #1, the green ceramic wafer is placed on a table; a via fill mask that has via holes which correspond to the via holes of the wafer is placed on the wafer; a blob of conductive ink is placed on the via fill mask; and the squeegee is used to manually press the ink through the via fill mask and into the via holes of the ceramic wafer by moving the squeegee back and forth with a rolling-pin type motion. An actual squeegee is made of urethane, and is about three-eighths of an inch square and six inches long. Via holes which are filled by this method, however, are deficient since they are non-hermetic and have enlarged elliptical-shaped tops as described in the Detailed Description in conjunction with FIG. 5.

Another via hole-filling method which the inventor used and which is herein called method #2 involves providing a hollow cylinder which is partially filled with the ink. One end of the cylinder is covered with a mask that has via holes which correspond to the via holes of the green ceramic wafer; and the other end of the cylinder is fitted with a piston. In operation, the cylinder is positioned such that the mask lies on the wafer and the corresponding via holes are aligned; and thereafter, the piston is pushed to squeeze a portion of the conductive ink out of the cylinder and into the via holes of the wafer. However, this method is deficient since it too produces non-hermetic via holes with enlarged tops as described in the Detailed Description in conjunction with FIG. 6.

Accordingly, a primary object of the invention is to provide a machine for filling via holes of a green ceramic wafer with conductive ink in a superior fashion. Another object of the invention is to provide a machine for filling via holes in a green ceramic wafer such that the filled holes are hermetic.

BRIEF SUMMARY OF THE INVENTION

These objects, and others, are achieved in accordance with the invention by a machine which comprises: a hollow member having an open face; a masking member covering the open face and having a plurality of via holes which are arranged across the face such that they match the via holes in the wafer that are to be filled; an elastic diaphragm inside of the hollow member having a front surface that forms a first cavity with the masking member for receiving a conductive ink and having a back surface that forms a second cavity with the hollow member; a base for holding the wafer against the masking member such that the matching holes are aligned; and an orifice through the hollow member for introducing a gas under pressure into the second cavity and against the back surface of the diaphragm to thereby squeeze a portion of the conductive ink through the holes of the masking member and into the holes of the wafer.

BRIEF DESCRIPTION OF THE DRAWINGS

Various features and advantages of the invention are described in the following Detailed Description in conjunction with the accompanying drawings wherein.

DETAILED DESCRIPTION OF THE INVENTION

Figure 1:
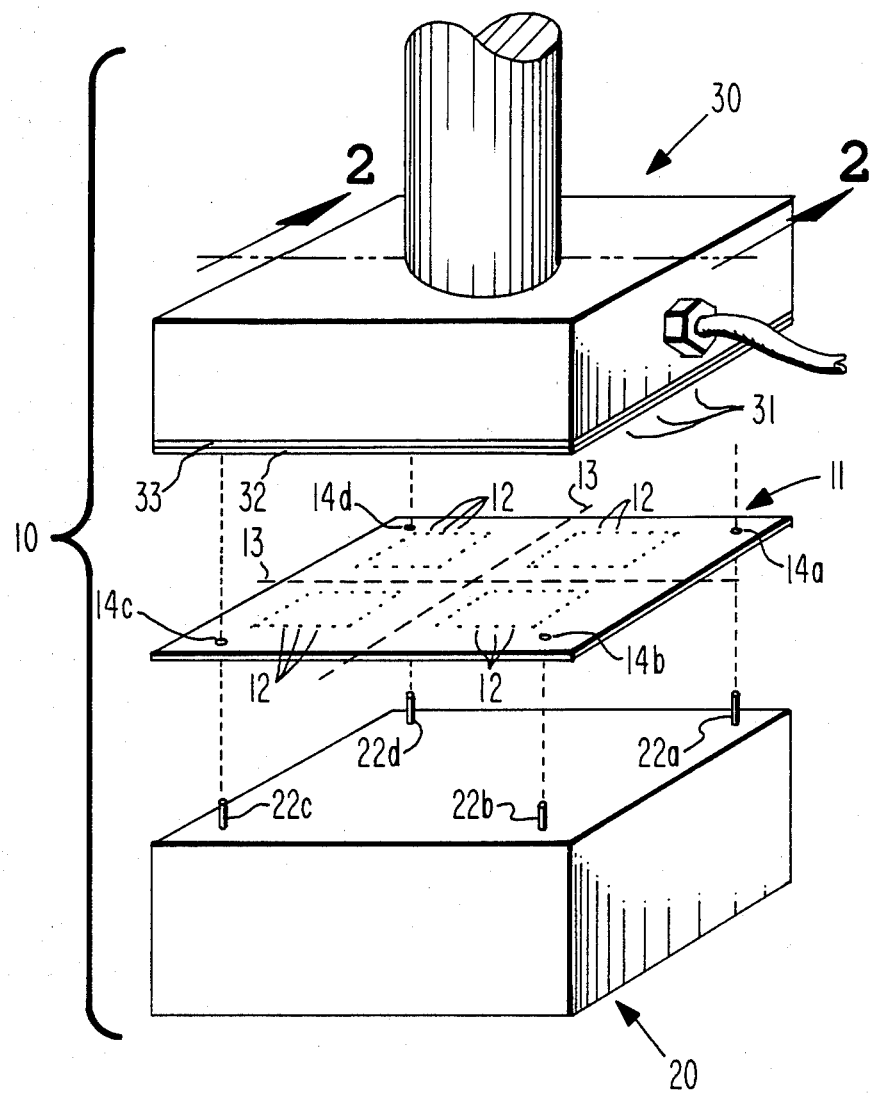
FIG. 1 is a pictorial view of a machine that is constructed according to the invention.

Referring now to FIG. 1, a preferred embodiment of a machine 10 that is constructed according to the invention will be described. Machine 10 operates on a flat green ceramic wafer 11; and more particularly, it operates to fill a plurality of via holes 12 in the wafer with an electrically conductive ink—such as a tungsten ink—which has a viscosity that is high like that of dough or putty.

Typically, the holes 12 are ten mils or sixteen mils in diameter, but they range anywhere from five to twenty-five mils. Preferably, the thickness of wafer 11 is less than twice the hole diameter. The holes are arranged in a pattern that is repeated a number of times on wafer 11 as shown by lines 13. After the holes are filled with the conductive ink, wafer 11 is removed from the machine and processed to a finished integrated circuit package as described in the background of the disclosure.

Included in machine 10 is a base member 20 having a flat surface 21 for supporting the wafer 11. Extending perpendicular to surface 21 are four alignment posts 22a–22d which fit through corresponding holes 14a–14d in wafer 11 to thereby accurately position the wafer on surface 21.

Further included in machine 10 is a moveable hollow member 30 having an open face 31 that is parallel to surface 21 and is large enough to surround all of the via holes 12 in wafer 11. A masking member 32 and a diaphragm 33 lie across the opening of face 31 as illustrated in detail in FIG. 2.

Figure 2:
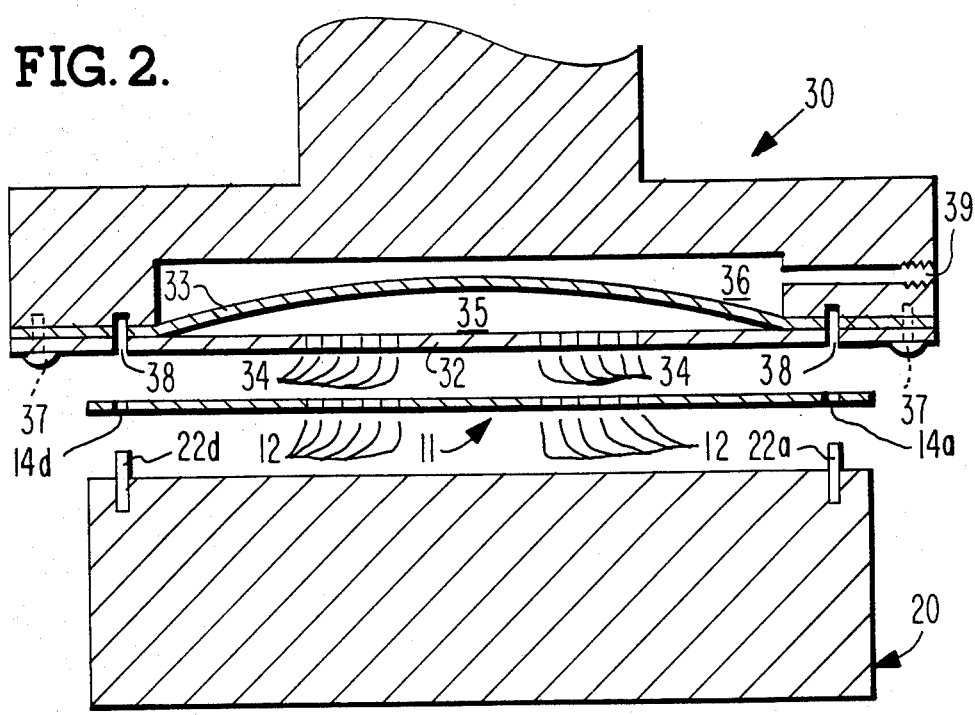
FIG. 2 is a sectional view of the machine of FIG. 1 taken along lines 2—2 and expanded to the machine's actual size.

As FIG. 2 shows, the masking member 32 is attached across the face 31 of member 30; and it has a plurality of via holes 34 that are arranged across face 31 in correspondence with the via holes 12 of wafer 11. Diaphragm 33 also lies across face 31, but it is disposed in the opening of face 31 behind the masking member 32. Consequently, the front surface of diaphragm 33 forms a cavity 35 with masking member 32 while the back surface of diaphragm 33 forms another cavity 36 with member 30. A plurality of screws 37 hold diaphragm 33 and masking member 32 in place.

In operation, the conductive ink is placed in cavity 34 by temporarily removing some of the screws 37. Thereafter, wafer 11 is placed on surface 21 of base member 20 such that the alignment holes 14a–14d fit over the alignment posts 22a–22d. Member 30 is then moved such that mask 32 presses against base 20 with wafer 11 sandwiched therebetween. Members 20 and 30 are pressed together with a total force of one to five tons. Alignment holes 38 are provided in members 32, 33, and 30 into which the posts 22a–22d fit to thereby place the via holes 34 and 12 in alignment.

Member 30 is also provided with an orifice 39 which goes into cavity 36. After wafer 11 is sandwiched between components 20 and 30 as described above, a fluid such as air is introduced under pressure through orifice 39 into cavity 36. This pressurized fluid squeezes a portion of the conductive ink in cavity 35 through the via holes 34 in masking member 32 and into the aligned via holes 12 of wafer 11. Suitably, an air pressure of 25–35 psi is applied for two to four seconds through orifice 39, and then the pressure is reduced to atmospheric.

Figure 3:
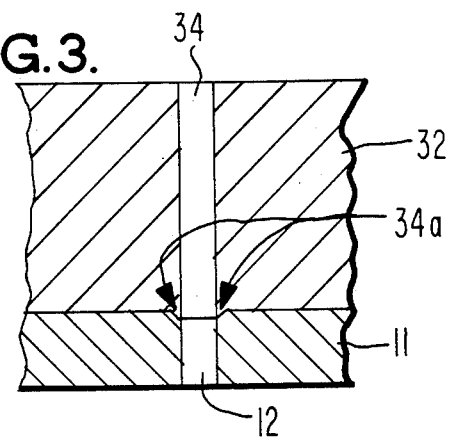
FIG. 3 is a greatly enlarged sectional view of a portion of a masking member and workpiece in FIG. 2.

Preferably, the via holes 34 of masking member 32 are respectively surrounded by a small pliable mass that forms a seal with the via holes 12 of wafer 11 when member 32 and wafer 11 are pressed together. This small pliable mass is illustrated in FIG. 3 by reference numeral 34a. As an example of some actual dimensions, mass 34a is 1.5 mils high; masking member 32 is 60 mils thick; and wafer 11 is 20 mils thick.

Suitably, mass 34a can be fabricated by constructing member 32 of a soft steel such as cold rolled steel or a low carbon steel, and by drilling the via holes 34 outwards towards the surface that will face wafer 11. Such drilling produces a small burr around each via hole 34 which can subsequently be made smooth and reduced to the desired height by stoning—that is, by using a flat sharpening stone for a knife.

Preferably, diaphragm 33 is constructed of an elastic material, such as 15 mil thick rubber, and it is placed across the open face of member 30. With this construction, any amount of conductive ink that is placed in cavity 35 is always under an air seal that is produced by the elastic diaphragm 33, the mask 32, and the ink in the holes 34 of mask 32. None of the ink is sucked out of any of the via holes 34 in mask 32 by the drop in pressure that occurs in cavity 36 after the ink has been squeezed into the holes 12 of wafer 11. If the ink is sucked out of the via holes 34 and air is sucked in, the air will cause the ink to dry and harden on the sidewalls of the via holes 34 which in turn will reduce the via holes' diameter and cause them to clog.

Figure 4:
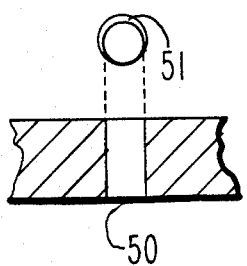
FIG. 4 shows top and sectional views of a via hole that is filled by the machine of FIGS. 1-3.

By utilizing machine 10 as described above to fill the via holes 12 in wafer 11, superior results are obtained. FIG. 4 shows that a via hole 12 which is filled by machine 10 has a cross section 50 that is free of microscopic cracks—that is, the filled hole is hermetic. Also, the hole has a top which is surrounded by a ring 51 of the conductive ink that is very narrow—i.e., less than one mil wide.

Figure 5:
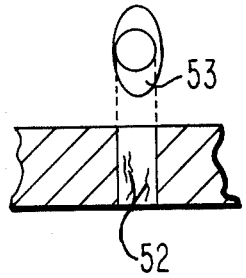
FIGS. 5 and 6 show top and sectional views of via holes that are filled by alternative means.

By comparison, FIG. 5 shows a via hole which is filled by the alternative method #1 as described in the background portion of this disclosure. This via hole has multiple hairline cracks 52 in its cross section that run parallel to the axis of the via hole, and it has a top which is surrounded by a large ellipse 53 of the conductive ink. For a 10 mil diameter hole, the major axis of ellipse 53 is typically 18 mils long and the minor axis is typically 13 mils long.

Figure 6:
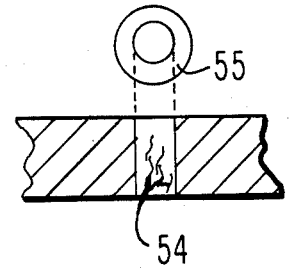

FIG. 6 shows another via hole which is filled by method #2 as described in the background portion of this disclosure. This filled via hole also has multiple hairline cracks 54 in its cross section that run parallel to the axis of the via hole, and it has a top which is surrounded by a large circle 55 of the conductive ink. For a 10 mil diameter hole, circle 55 typically is 17 mils in diameter.

A problem with the hairline cracks 52 and 54 in the filled via holes of FIGS. 5 and 6 is that they trap contaminants; and over a period of time these contaminants cause corrosion. Thus the electrical conductivity of the filled via holes deteriorates with time. Also, a problem with the extensions 53 and 55 of the ink beyond the perimeter of the hole in FIGS. 5 and 6 is that they limit the minimum distance by which the holes can be spaced without shorting to one another, and they limit the minimum distance by which a conductor can be routed next to the hole without shorting.

A preferred embodiment of the invention has now been described in detail. In addition, however, many changes and modifications can be made to this embodiment without departing from the nature and spirit of the invention. Thus, it is to be understood that the invention is not limited to said details but is defined by the appended claims.

What is claimed is:

1. A machine for filling a plurality of via holes in a flat workpiece, comprising:
    a base member having a flat surface for supporting said flat workpiece such that said via holes are perpendicular to said surface;
    a moveable hollow member having an open face that is parallel to said flat surface and surrounds said via holes;
    a masking member attached across said open face and having a plurality of via holes that are arranged across said open face in correspondence with said via holes in said workpiece;
    a diaphragm inside of said hollow member having a front surface that forms a first cavity with said masking member and having a back surface that forms a second cavity with said hollow member;
    a high viscosity substance within said first cavity;
    means for pressing said masking member against said base with said workpiece sandwiched therebetween such that said via holes in said masking member and said workpiece are aligned;

said hollow member having an orifice for introducing a fluid under pressure into said second cavity and against the back surface of said diaphragm to thereby squeeze a portion of said high viscosity substance through said via holes in said masking member and into said via holes of said part.

2. A machine according to claim 1 wherein said via holes of said masking member are respectively surrounded by a small pliable mass that forms a seal with the via holes of said workpiece when said masking member and said workpiece are pressed together.

3. A machine according to claim 1 wherein said diaphragm is elastic and is stretched by said high viscosity substance to a degree which insures that said high viscosity substance is not sucked out of said via holes in said masking member by any transient drop in pressure in said second cavity.

4. A machine according to claim 1 wherein said masking member is removably attached to said hollow member and said hollow member is adapted to receive other masking members with respective via hole patterns that are all different.

5. A machine according to claim 1 wherein said substance in said first cavity is electrically conductive and has a dough-like consistency.

6. A machine according to claim 1 wherein said via holes are 5-25 mils in diameter.

7. A machine for filling a plurality of holes in a workpiece, comprising:
a hollow member having an open face;
a masking member covering said face and having a plurality of holes which are arranged across said face such that they match said holes in said workpiece;
a diaphragm inside of said hollow member having a front surface that forms a first cavity with said masking member for receiving a high viscosity substance and having a back surface that forms a second cavity with said hollow member;
means for holding said workpiece against said masking member such that their respective holes are aligned;
said hollow member having an orifice for introducing a fluid under pressure into said second cavity and against the back surface of said diaphragm to thereby squeeze a portion of said high viscosity substance through said holes of said masking member and into said holes of said workpiece.

8. A machine according to claim 7 wherein said holes of said masking member are respectively surrounded by a small pliable mass for forming a seal with corresponding holes of a workpiece when said masking member and said workpiece are pressed together.

9. A machine according to claim 7 wherein said diaphragm is elastic and is stretched by said high viscosity substance to a degree which insures that said high viscosity substance is not sucked out of said holes in said masking member by any transient drop in pressure in said second cavity.

10. A machine according to claim 7 wherein said holes are 5-25 mils in diameter.

11. A machine comprising:
a hollow member having an open face;
a masking member covering said face and having a plurality of holes that are arranged across said face in a predetermined pattern;
a diaphragm inside of said hollow member having a front surface that forms a first cavity with said masking member for receiving a high viscosity substance and having a back surface that forms a second cavity with said hollow member;
said hollow member having an orifice for introducing a fluid under pressure into said second cavity and against the back surface of said diaphragm to thereby squeeze a portion of said high viscosity substance through said holes.

* * * * *